US008582341B2

(12) United States Patent
Fukuzumi et al.

(10) Patent No.: US 8,582,341 B2
(45) Date of Patent: Nov. 12, 2013

(54) SEMICONDUCTOR DEVICE AND METHOD FOR MANUFACTURING SAME

(75) Inventors: Yoshiaki Fukuzumi, Kanagawa-ken (JP); Takeshi Imamura, Mie-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 13/424,552

(22) Filed: Mar. 20, 2012

(65) Prior Publication Data
US 2013/0070508 A1    Mar. 21, 2013

(30) Foreign Application Priority Data
Sep. 15, 2011   (JP) .................................. 2011-201903

(51) Int. Cl.
*G11C 5/06*    (2006.01)
(52) U.S. Cl.
USPC .................................. 365/63; 365/51; 365/72
(58) Field of Classification Search
USPC ........... 365/63, 51, 72, 185.17; 257/324, 319, 257/E21.606; 438/128
See application file for complete search history.

(56) References Cited

U.S. PATENT DOCUMENTS

| 7,345,898 B2* | 3/2008 | Park et al. ....................... 365/63 |
| 7,800,163 B2 | 9/2010 | Izumi et al. |
| 2007/0165276 A1 | 7/2007 | Nakashima |
| 2010/0207195 A1 | 8/2010 | Fukuzumi et al. |

FOREIGN PATENT DOCUMENTS

JP    10-50989    2/1998

* cited by examiner

*Primary Examiner* — David Lam
(74) *Attorney, Agent, or Firm* — Oblon, Spivak, McClelland, Maier & Neustadt, L.L.P.

(57) ABSTRACT

According to an embodiment, a method of manufacturing a semiconductor device including a memory array provided on a substrate, and a control circuit provided on a surface of the substrate between the substrate and the memory array, includes steps of forming, in an insulating layer covering a p-type semiconductor region and an n-type semiconductor region of the control circuit, a first contact hole communicating with the p-type semiconductor region; forming a contact plug, in contact with the p-type semiconductor region, within the first contact hole; forming, in the insulating layer, a second contact hole communicating with the n-type semiconductor region; and forming an interconnection contacting the contact plug and the n-type semiconductor region exposed within the second contact hole.

20 Claims, 16 Drawing Sheets

US 8,582,341 B2

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2011-201903, filed on Sep. 15, 2011; the entire contents of which are incorporated herein by reference.

FIELD

Embodiments are related generally to a semiconductor device and a method for manufacturing the same.

BACKGROUND

The development of microfabrication technology in the manufacturing processes for a semiconductor device has driven the implementing of increased capacities for semiconductor memory. Consequently, the cost of photolithography, which plays a central role in this achievement, increases considerably in conjunction with the advancement of microfabrication. Therefore, a semiconductor device has been suggested wherein a plurality of holes are formed collectively going through a plurality of electrodes which are laminated onto a substrate, and the memory structure is formed on the inner part of the plurality of holes. According to this method, it is possible to collectively form a three dimensional memory array comprised of a plurality of memory strings, reducing the amount of photolithography needed, and therefore it is possible to reduce the manufacturing costs.

Increased capacity together with reduced size is required for semiconductor memory. For example, a semiconductor device has been suggested wherein the control circuit for driving the memory cell is provided directly under the memory array, thereby shrinking the chip size. However, the high temperature annealing within the manufacturing process inhibits the implementation of a semiconductor device having the control circuit under the memory array. Accordingly, there is a need for a semiconductor device and method of manufacturing the same whereby it is possible to provide a configuration having memory cells that can be formed collectively, with a control circuits provided directly thereunder.

DETAILED DESCRIPTION

Figure 1:
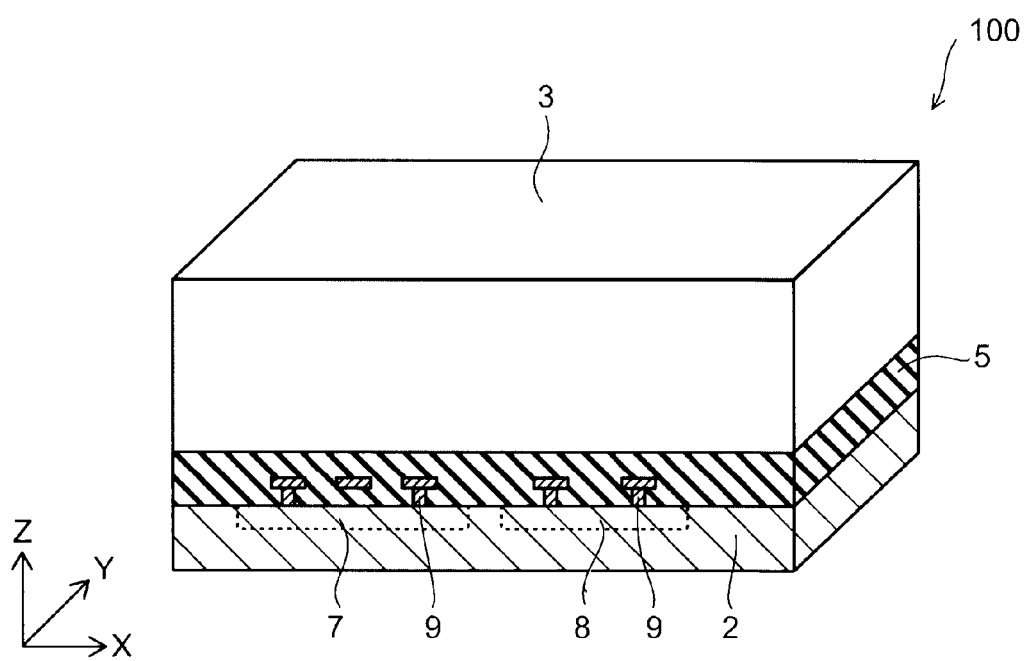
FIG. 1 is a perspective view schematically illustrating a semiconductor device according to a first embodiment.

According to an embodiment, a method of manufacturing a semiconductor device including a memory array provided on a substrate, and a control circuit provided on a surface of the substrate between the substrate and the memory array, includes steps of forming, in an insulating layer covering a p-type semiconductor region and an n-type semiconductor region of the control circuit, a first contact hole communicating with the p-type semiconductor region; forming a contact plug, in contact with the p-type semiconductor region, within the first contact hole; forming, in the insulating layer, a second contact hole communicating with the n-type semiconductor region; and forming an interconnection contacting the contact plug and the n-type semiconductor region exposed within the second contact hole.

Embodiments of the invention will now be described with reference to the drawings. Moreover, the same parts in the drawings are referred to by the same numbers, with detailed explanations omitted, and different parts are explained.

(The First Embodiment)

FIG. 1 is a perspective view schematically illustrating a semiconductor device 100 according to a first embodiment. As illustrated in FIG. 1, the semiconductor device 100 has, for example, a memory array 3 provided on a substrate 2, and control circuits 7 and 8 provided on the surface of the substrate 2 between the substrate 2 and the memory array 3. An insulating layer 5 is provided between the substrate 2 and the memory array 3 to electrically isolate the memory array 3 and the control circuits 7, 8. Furthermore, an interconnection 9 is formed within the insulating layer 5, electrically connecting the space between the control circuit 7, 8 and the memory array 3. Although the interconnection 9 illustrated in FIG. 1 is a single layer, the interconnection 9 may also be multilayer interconnection provided with a plurality of interconnection layers and interlayer insulating film mutually provided therebetween.

The control circuits 7 and 8 are provided with, for example, a sense amplifier, a word line driver, and a pump circuit generating high voltage, and are provided on the surface of the substrate 2 in order to drive the memory array 3. The control circuits 7 and 8 are integrated circuits containing a plurality of MOS transistors.

In a manufacturing process of the semiconductor device 100, first, the control circuits 7 and 8, and the interconnection 9 are formed on the surface of the substrate 2. Subsequently, the memory array 3 is formed over the insulating layer 5. Accordingly, the integrated circuit is completed on the surface of the substrate 2, and then, the manufacturing process for the memory array 3 is performed. Hence, it is desirable that the characteristics of the control circuits 7 and 8 do not change, or, that the control circuits 7 and 8 will properly operate after being subjected to high temperature annealing during the manufacturing of the memory array 3.

Figure 2:
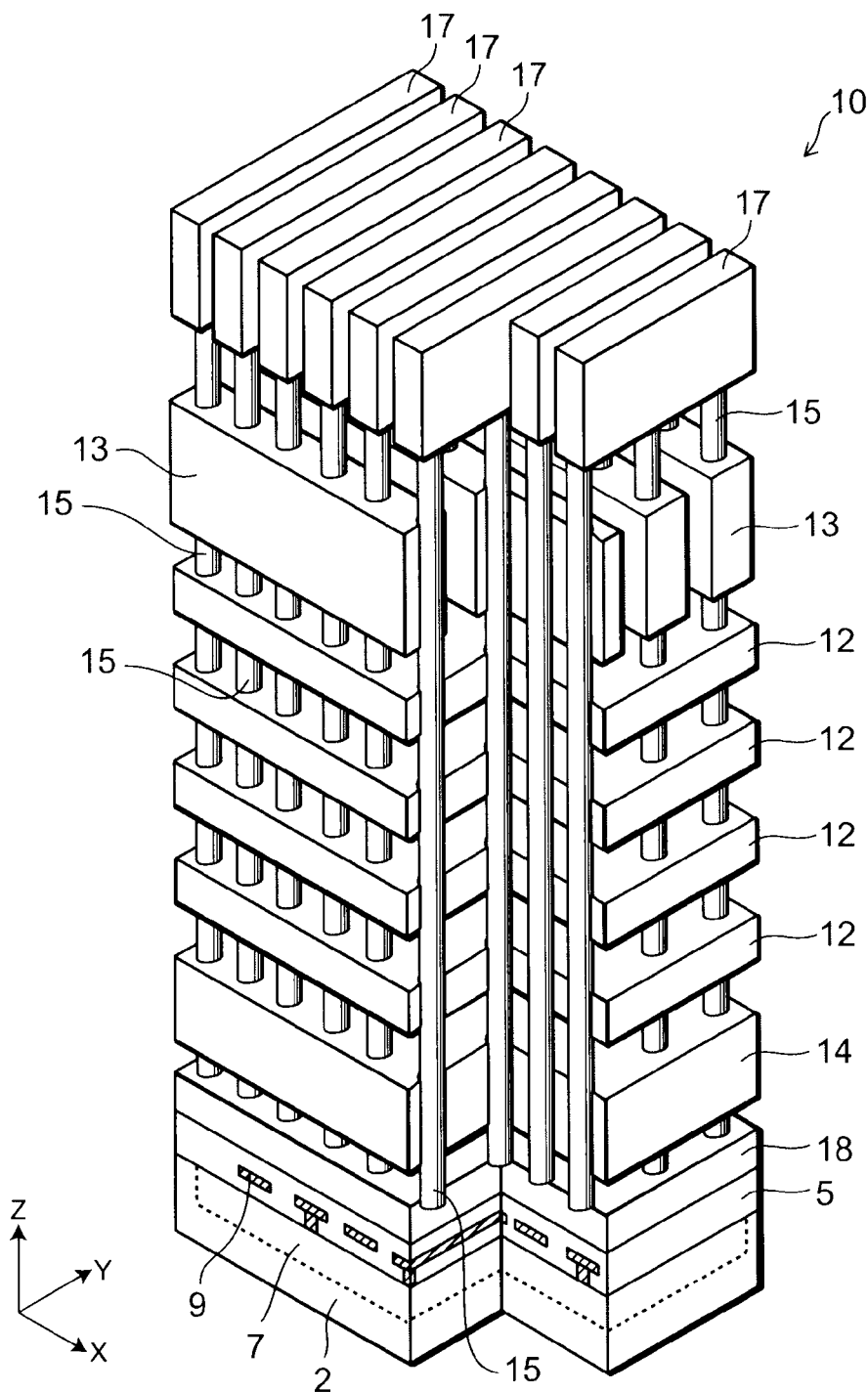
FIG. 2 is a perspective view schematically illustrating a memory array according to the first embodiment.

Next, an example of the memory array 3 according to the embodiment will be explained with reference to FIGS. 2 and 3. FIG. 2 is a perspective view schematically illustrating a vertical memory array 10 containing memory strings extending in the Z direction perpendicular to the surface of the substrate 2. Whereas, FIG. 3 is a perspective view schematically illustrating a lateral memory array 20 containing memory strings extending in the X direction parallel to the surface of the substrate 2.

A plurality of electrodes 12, 13, 14, and a source line 18 are laminated in the memory array 10 as illustrated in FIG. 2. In addition, a silicon pillar 15 is provided going throughout the electrode layers 12, 13, and 14 in the Z direction. Both ends of the silicon pillar 15 are connected to a bit line 17, and a source line 18. An insulating layer (not illustrated) is provided between the electrode layer 12, 13, 14, the source line 18, and the bit line 17 is, electrically isolating the respective components.

Figure 3:
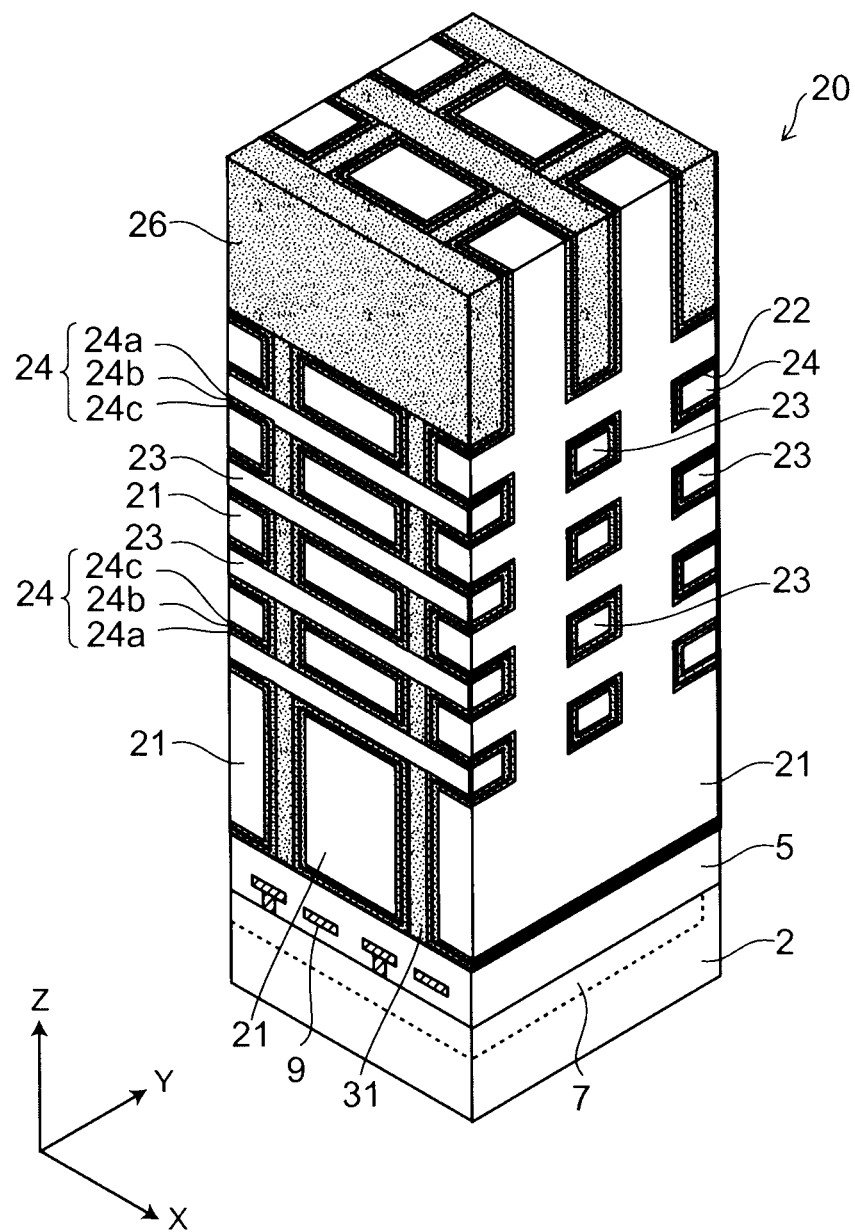
FIG. 3 is a perspective view schematically illustrating another memory array according to the first embodiment.

The silicon pillar 15 is provided with a memory structure including a channel layer, a gate insulating film, and an electrical charge storage layer (Refer to FIG. 3). Each of the plurality of electrode layers 12 functions as a word line and controls the electric charge being preserved in the memory structure. The electrode layers 13 and 14 function as the selection gates for a selection transistor. Namely, the silicon pillar 15 and the electrode layers 12, 13, 14 form a NAND type memory string connecting a plurality of memory cells in series.

As above mentioned, a control circuit 7 is formed on the surface of the substrate 2 between the substrate 2 and the memory array 10. In addition, in the portion not illustrated, the interconnection 9 provided on the insulating layer 5 electrically connects the control circuit 7 and the memory array 10.

In the process of manufacturing the memory array 10, a plurality of openings going through the plurality of electrode layers 12, 13 and 14, provided on the substrate 2 are formed collectively, and the memory structure is formed in the openings. Hereby for example, it is possible for the primary portion of the three dimensional memory array to be formed through one photolithography step.

Whereas, in the horizontal type memory array 20 illustrated in FIG. 3, a silicon beam 23 is provided going through the plurality of word lines 21 in the X direction. Also in this case, a plurality of silicon beams 23 is formed by collectively shaping a plurality of polysilicon (polycrystalline silicon) layers laminated over a silicon oxide film in the Z direction into stripes extending in the X direction.

Further, a plurality of silicon oxide layers 31 are formed extending in parallel with the Y-Z surface, and are lined up so as to be separated from each other in the X direction. In this case, a space where a portion of the silicon beam 23 is exposed is formed between adjacent silicon oxide layers 31. Then, a silicon oxide film 24a, a silicon nitride film 24b, a silicon oxide film 24c, and a polysilicon layer 21 are formed in that order in that space. This can form an ONO structure (the laminated structure of silicon oxide film 24a/silicon nitride film 24b/silicon oxide film 24c) which surrounds the periphery of the silicon beam 23, and a polysilicon layer 21 which fills the space between adjacent silicon beams 23.

In the memory array 20, the silicon beam 23 functions as a channel layer, the silicon oxide film 24a as a gate insulating film, and the silicon nitride film 24b as an electrical charge storage layer. The silicon oxide film 24c insulates between the polysilicon layer 21 and the silicon nitride film 24b. The polysilicon layer 21 functions as a word line controlling the electrical charge stored at the silicon nitride film 24b, and further controls the on and off of the channel formed between the silicon beam 23 and the silicon oxide film 24a.

In the memory array 20 memory strings extending in the horizontal direction are formed with the silicon beam 23 and a plurality of word lines 21. Bit lines and source lines are provided at both ends (not illustrated) of silicon beam 23. Further, selection gates (not illustrated) are provided on both sides of the plurality of word lines 21. In addition, the control circuit 7 provided on surface of the substrate 2 between the substrate 2 and the memory array 20, and for example, the word lines, the bit lines, and the selection gates are electrically connected with the interconnection 9.

In order to improve the characteristics of the above mentioned types of memory arrays 10 and 20, it is preferable to anneal the silicon pillar 15 and silicon beam 23, and the laminated film of the ONO structure. Further, during the annealing process, it is desirable for the control circuit provided on the surface of the substrate 2 to be capable of suppressing deterioration of the characteristics thereof.

Next, the process of manufacturing a semiconductor device 100 according to this embodiment will be explained with reference to FIGS. 4, 5, 6A and 6B. The FIGS. 4, 5, 6A and 6B are schematic drawings illustrating the process of manufacturing a control circuit provided on the surface of a silicon substrate 2.

Initially, a CMOS circuit containing a PMOS transistor and an NMOS transistor is provided as the control circuit. Subsequently, an insulating layer 25 covering the surface of a silicon substrate 2 is formed, and for example, an interconnection connecting a control circuit and a memory array, and an interconnection connecting to a power source or a ground electric potential, and so forth are provided.

Figure 4:
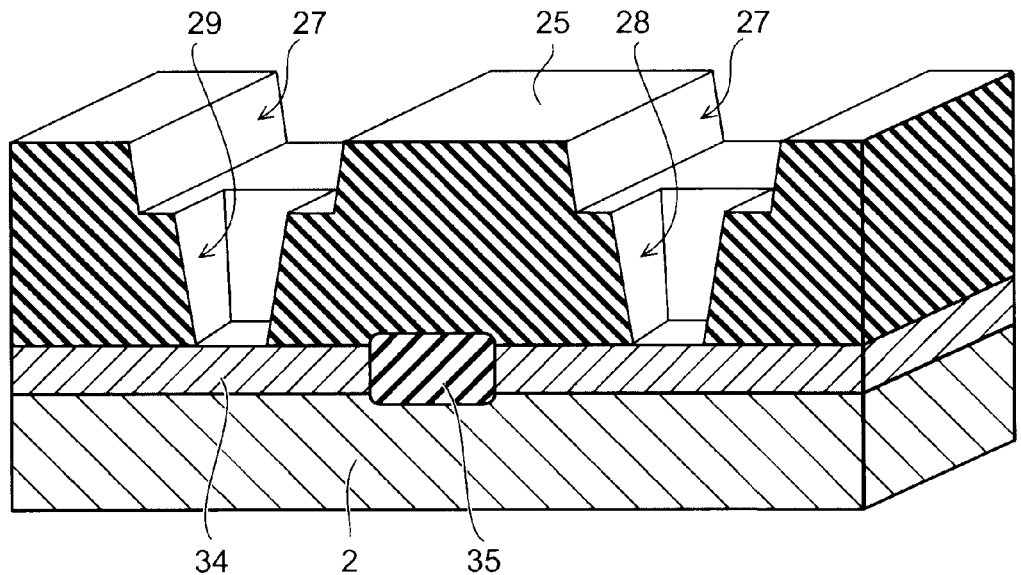
FIGS. 4 to 10 are schematic views illustrating a manufacturing process of the semiconductor device according to the first embodiment.

FIG. 4 is a perspective view illustrating the state in which a first contact hole 28 communicating with a p-type semiconductor region 33 and a second contact hole 29 communicating with an n-type semiconductor region 34 are formed in an insulating layer 25 that covers the p-type semiconductor region 33 and the n-type semiconductor region 34 of the control circuit. As illustrated in the same drawing, the contact holes 28 and 29 are formed on the bottom of the interconnection groove 27.

Sophisticated microfabrication technology is applied in the process forming the contact holes 28 and 29. Hence, it may be preferable to reduce the cost of the photolithography process by simultaneously forming the contact hole 28 which communicates with the p-type semiconductor region 33 and the contact hole 29 which communicates with the n-type semiconductor region 34.

The p-type semiconductor region 33 is for example the source or drain region for a PMOS transistor, or, a contact region connecting the source and drain region of a PMOS transistor. Further, the p-type semiconductor region 33 may also be a contact region connecting to the body region of an NMOS transistor. These types of p-type semiconductor regions 33 are doped with, for example, boron (B), as a p-type impurity. Whereas, the n-type semiconductor region 34 is for example the source or drain region for an NMOS transistor, or, a contact region connecting the source and drain region of an NMOS transistor. Further, there are cases where the n-type semiconductor region 34 is a contact region connecting to the body region of a PMOS transistor. These types of n-type semiconductor regions 34 are doped with, for example, arsenic (As), as an n-type impurity.

A shallow trench 35 is formed between the p-type semiconductor region 33 and the n-type semiconductor region 34 (Shallow Trench Isolation). Then, a silicon oxide film formed from TetraEthOxySilane (TEOS) by the Chemical Vapor Deposition (CVD) process may be used for the insulating layer 25 covering the p-type semiconductor region 33 and the n-type semiconductor region 34.

Figure 5:
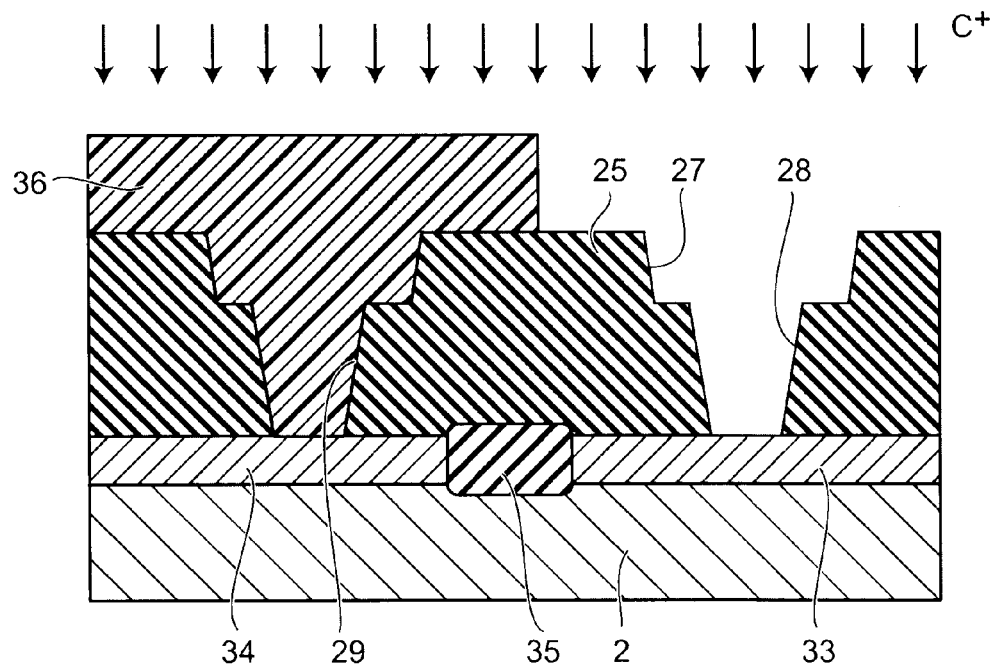

Next, as illustrated in FIG. 5, carbon ions (C+) are implanted into the p-type semiconductor region 33 exposed on the bottom of the contact hole 28. In this case, the contact hole 29 communicating with the n-type semiconductor region 34 is covered with a resist film 36 so that carbon is not implanted into the n-type semiconductor region 34.

The ion implantation of carbon is performed with ion implantation energy of 3 keV, and dose amount of $1 \times 10^{15}$ cm$^{-2}$, for example. Furthermore, the carbon ions may be implanted after ion implantation of boron (B) which is a p-type impurity. To illustrate, boron is ion implanted under the conditions of ion implantation energy of 5 keV, and dose amount of $3 \times 10^{15}$ cm$^{-2}$, for example; thereafter carbon is ion implanted under the above mentioned conditions.

A resist film 36 covers the contact hole 29, and is provided so that carbon ions are not implanted on the bottom of the contact hole 29, and thus, the resist film may be formed by a roughly accurate photolithography process. That is, a low cost photolithography technology may be used for forming the resist film.

Next, the resist film 36 is removed, and annealing is performed to activate the implanted elements. For example, annealing is performed by the Rapid Thermal Annealing (RTA) process at 950° C. for approximately 10 seconds. Using diluted hydrofluoric acid solution, the natural oxidation film on the p-type semiconductor region 33 and the n-type semiconductor region 34 exposed at the bottom of the contact holes 28 and 29 is removed, depositing in the contact holes the metal film that will become the contact plugs.

Figure 6A:
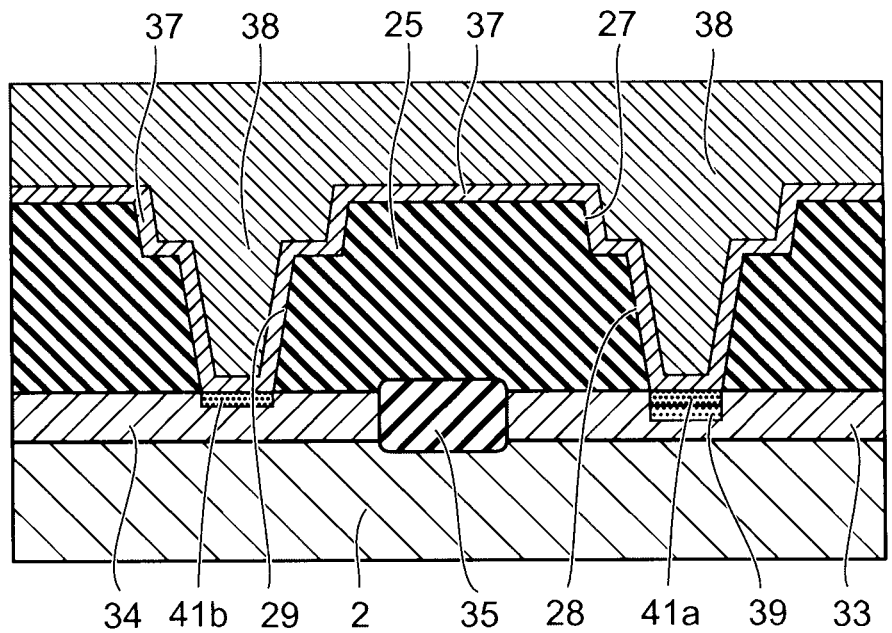

As illustrated in FIG. 6A, for example, a Ti/TiN film 37 laminated from a titanium (Ti) layer and a titanium nitride (TiN) layer, and a tungsten film (W) 38 are sequentially deposited by means of the CVD process. The Ti layer initially deposited is formed in contact with the p-type semiconductor region 33 which is exposed on the bottom of the contact hole 28, in contact with the n-type semiconductor region 34 which is exposed on the bottom of the contact hole 29, and in contact with the surface of the insulating layer 25.

For example, the Ti layer is deposited from titanium chloride ($TiCl_4$) by the CVD process. In this case, by setting the deposition temperature to no less than 600° C., silicide layers 41a and 41b are respectively formed at the interface between the p-type semiconductor region 33 and the Ti layer and at the interface between the n-type semiconductor region 34 and the Ti layer.

Subsequently, the TiN film is formed on the Ti layer; furthermore, a layer of W film 38 thicker than the Ti/TiN film 37 is formed, burying the inner part of the contact holes 28 and 29, and the inner part of the interconnection groove 27.

Figure 6B:
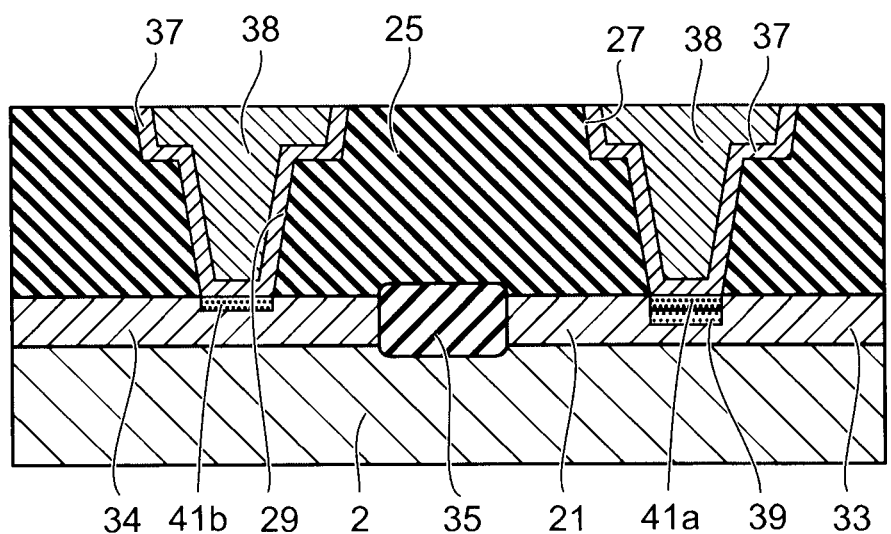

Subsequently, as illustrated in FIG. 6B, the Ti/TiN film 37 and the W film 38 formed on the top surface of the insulating layer 25, are removed by a Chemical Mechanical Polishing (CMP) process. This forms what is called a dual-damascene interconnection which includes the contact plug embedded into the inner part of the contact holes 28 and 29, and the laminated interconnection embedded into the interconnection groove 27.

Furthermore, in the embodiment, as illustrated in FIG. 6A and FIG. 6B, on the bottom of the contact hole 28, the carbon implanted layer 39 and a silicide layer 41a piled thereon are formed in the surface portion of the p-type semiconductor region 33 in contact with the Ti/TiN film 37. The silicide layer 41a is partly overlapped with the carbon implanted layer 39.

In the processes hereafter, for example, a second interlayer insulating film including a contact plug and interconnection is arranged on top of the insulating layer 25, providing a multilayer interconnection. The insulating layer is then formed on top of the multilayer interconnection, and thereafter the memory array 3 is formed thereon. For example, the insulating layer 5 in between the substrate 2 and the memory array 3 illustrated in FIG. 1 is the one comprised of the insulating layer 25, the multilayer interconnection, and an insulating layer provided thereon. Furthermore, a power supply line, or a global signal line is arranged on the top part of the memory array 3, completing the semiconductor device 100.

As above described, high temperature annealing is performed in the process of manufacturing the memory array 3. For example, when a polysilicon layer is annealed and crystallized thereby improving the electron mobility, the read out current value may be increased. In order to do this, for example, there is the case where the substrate 2 on which the control circuits 7 and 8 are formed, is carried into an annealing furnace set at no less than 900° C. and heated for no less than 10 minutes. This is a more rigorous process compared to annealing for a short time according to the RTA process set at the same temperature.

For example, in the above mentioned multilayer interconnection, a metal film having the same the Ti/TiN/W layer structure as the first layer, may be used as the interconnection for the second layer. The Ti layer of the second layer is in contact with the W film 38 of the first layer, where the contact plug of the second layer is in contact with the interconnection of the first layer. Thereby, a low resistance contact is formed between the first and the second interconnections, and it is also possible to make them thermally stable. Thus, a metal interconnection capable of withstanding the annealing process during the process of manufacturing the memory array 3 can be realized.

Further, instead of the above mentioned interconnection, an interconnection may be formed using conductive polysilicon. However, interconnection formed from polysilicon has a higher resistance compared to metal interconnection. Hence, the speed of transmission of signals between the memory array and the control circuit decreases and there occurs the problem that the operation speed in the semiconductor device 100 becomes slower.

Accordingly, it is preferable to use metal for the interconnection provided between the memory array and the control circuit. Moreover, it is preferable that high melting point metals such as Ti, W and so forth are used, so as to withstand the annealing process during the process of manufacturing the memory array.

Furthermore, in the embodiment, as illustrated in FIG. 6B, the carbon implanted layer 39 is disposed between the p-type semiconductor region 33 and the contact plug (Ti/TiN film 37 plus W film 38) at the interface at which these elements are in contact. Thereby, diffusion of the doped boron into the p-type semiconductor region 33 can be suppressed, and an ohmic contact with low resistance via the silicide layer 41a can be maintained between the p-type semiconductor region 33 and the contact plug.

Namely, at the carbon implanted layer 39, the diffusion of boron can be suppressed during high temperature processing within the process of manufacturing the memory array 3, thereby preventing the reduction in the concentration of p-type impurities. Thereby, an ohmic contact of low resistance can be maintained.

As with the embodiment, when implanting ions with low acceleration energy, carbon (C) is distributed in the vicinity of the surface of the p-type semiconductor region 33. The implanted carbon is also taken up into the silicide layer 41a formed from the reaction of the Ti/TiN film 37 and the p-type semiconductor region 33. Thereby, it becomes possible to suppress the taking up of boron into the silicide layer 41a and the reduction in the boron concentration in the p-type semiconductor region 33.

Further, because the carbon ions are implanted on the bottom of the contact hole 28 separated from the gate electrode of the MOS transistor, it is possible to mitigate the effects of carbon on the transistor characteristics, and realize a highly reliable semiconductor device.

In contrast to this, the n-type semiconductor region 34, is doped with arsenic as the n-type impurity. The diffusion coefficient of arsenic is smaller than that of boron. Therefore, even if subjected to an annealing process at high temperature during the process of manufacturing the memory array 3, there is little change to the concentration of arsenic, and the contact resistance between the n-type semiconductor region 34 and the contact plug can be maintained at a low level.

As above mentioned, in the semiconductor device 100 according to the embodiment, the control circuit and the memory array 3 provided on substrate 2 are connected with an interconnection of a high melting point metal, and the carbon implanted layer 39 is interposed between the p-type semiconductor region 33 and the contact plug. This makes it possible to form interconnection capable of withstanding the high temperature annealing during the process of manufacturing the memory array 3, and thereby, a reduced chip size and an increased speed is realized by the structure wherein the control circuit is arranged under the memory array 3.

Although an example wherein carbon is ion implanted into the p-type semiconductor region 33 is illustrated in the embodiment, the ion implantation is not limited to this case. When implanting carbon into a semiconductor crystal including silicon, the implanted carbon atoms combine with the crystal defects and suppress the diffusion of impurities. Accordingly, without being limited to a boron doped p-type semiconductor region 33, similar effects may be obtained in a p-type semiconductor region doped with other impurities, or the n-type semiconductor region, and it is possible apply modifications to the embodiment. Further, the memory array 3 provided on the substrate 2, without being limited to the structures illustrated in FIG. 2 and FIG. 3, may also be another type of three dimensional memory array.

(The Second Embodiment)

FIGS. 7, 8A, 8B, 9A, 9B, and 10 are perspective views schematically illustrating the manufacturing process of a semiconductor device 100 according to a second embodiment. This embodiment differs from the first embodiment in that the semiconductor device 100 according to the embodiment has a contact plug consisting of polysilicon connected to the p-type semiconductor region 33. Below, the process of manufacturing the second embodiment is explained with reference to FIGS. 7, 8A, 8B, 9A, 9B, and 10.

Figure 7:
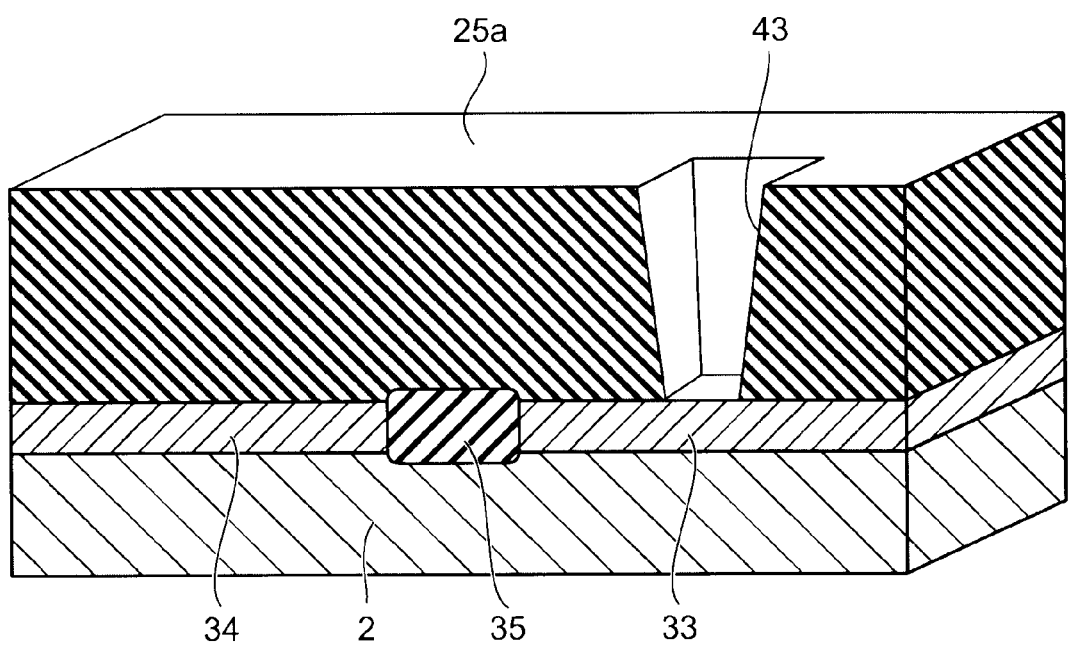

An insulating layer 25a is provided on the top of the substrate 2 covering a p-type semiconductor region 33 and an n-type semiconductor region 34 of a control circuit. First as illustrated in FIG. 7, a first contact hole 43 communicating with the p-type semiconductor region 33 is formed in the insulating layer 25a.

Figure 8A:
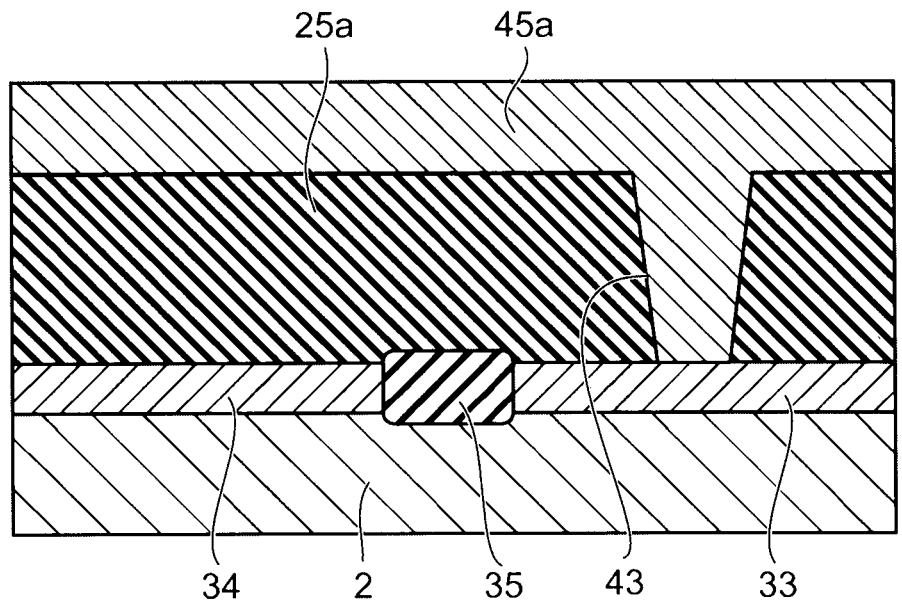

Next, the natural oxidation film on the surface of the p-type semiconductor region 33 exposed on the bottom of the contact hole 43 is removed by a diluted hydrofluoric acid solution. Then, as illustrated in FIG. 8A, for example, a polysilicon layer 45a is deposited, through a CVD process, on the insulating layer 25a and embedded in the inner part of the contact hole 43. The polysilicon layer 45a is preferably a conductive layer including a higher concentration of p-type impurities than the p-type semiconductor region 33. For example, the polysilicon layer is a p-type conductive layer including no less than $1 \times 10^{21}$ cm$^{-3}$ of boron (B).

Figure 8B:
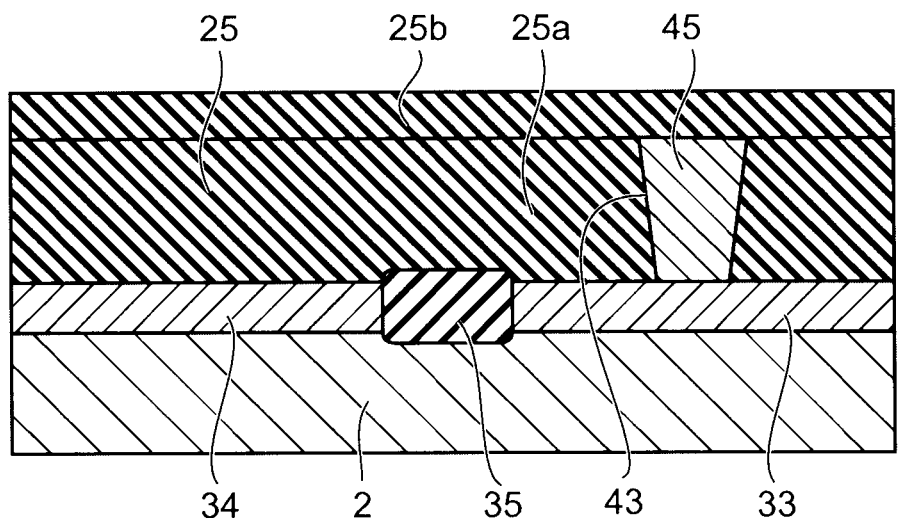

Subsequently the polysilicon layer 45a deposited on the upper face of the insulating layer 25a is removed, for example, through a CMP process, thereby forming a contact plug 45 embedded in the inner part of the contact hole 43. Moreover, as illustrated in FIG. 8B, an insulating layer 25b is formed on top of the insulating layer 25a. The insulating layer 25a and the insulating layer 25b are silicon oxide film formed from depositing TEOS through the CVD process.

Figure 9A:
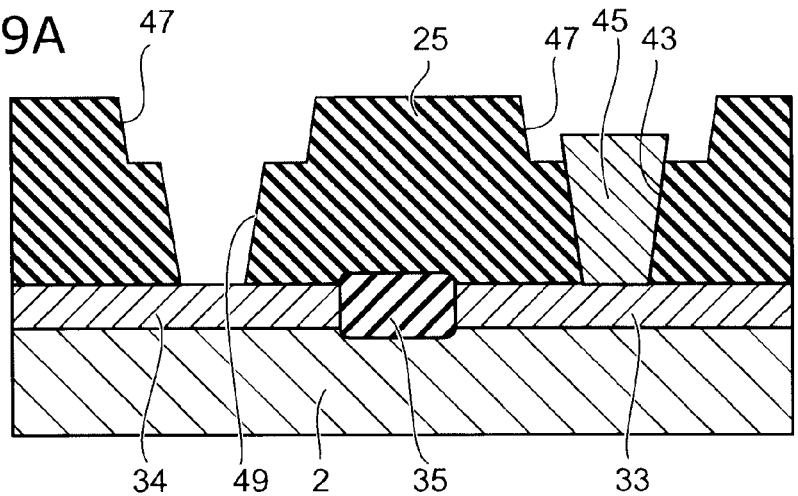

Next, a contact hole 49 communicating with the n-type semiconductor region 34 and an interconnection groove 47 are formed as illustrated in FIG. 9A. At the same time, a contact hole for a gate electrode (not illustrated) may be formed. On the p-type semiconductor region 33 side, a portion of the contact plug 45 is formed so as to protrude from the bottom of the interconnection groove 47. Thereby, the contact surface area between the metal interconnection formed in the interconnection groove 47 and the contact plug 45 is broadened, making the contact resistance lower. Note that, the insulating layer 25 illustrated in FIG. 9A includes the insulating layer 25a and the insulating layer 25b.

Figure 9B:
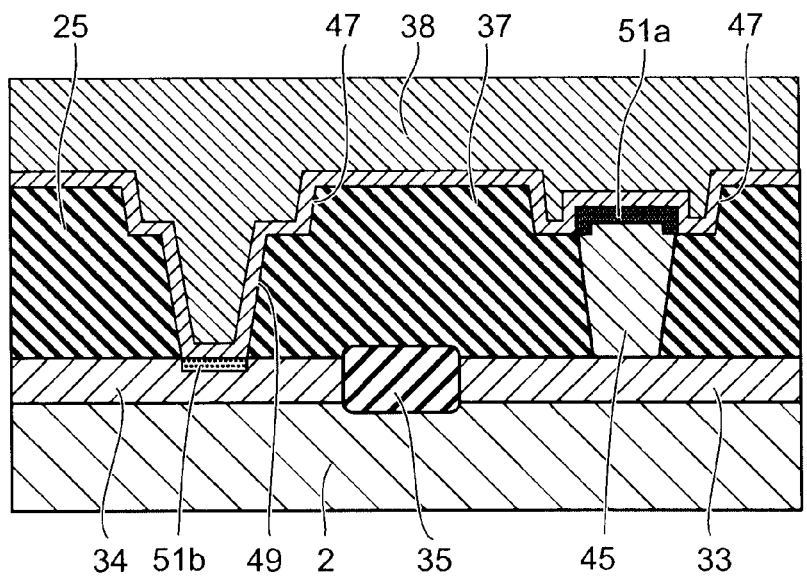

Subsequently, the natural oxidation film on the surface of the n-type semiconductor region 34 exposed on the bottom of the contact hole 49, and the surface of the contact plug 45 protruding from the bottom surface of the interconnection groove 47 is removed by a diluted hydrofluoric acid solution. Then as illustrated in FIG. 9B, a metal layer is deposited on the inner part of the contact hole 49, and within the interconnection groove 47. For example, a Ti/TiN film 37 and a W film 38 are sequentially deposited through a CVD process. In this case as above described, silicide layers 51a and 51b are respectively formed at the interface between the contact plug 45 and the Ti/TiN film 37, and at the interface between the n-type semiconductor region 34 and Ti/TiN film 37.

Figure 10:
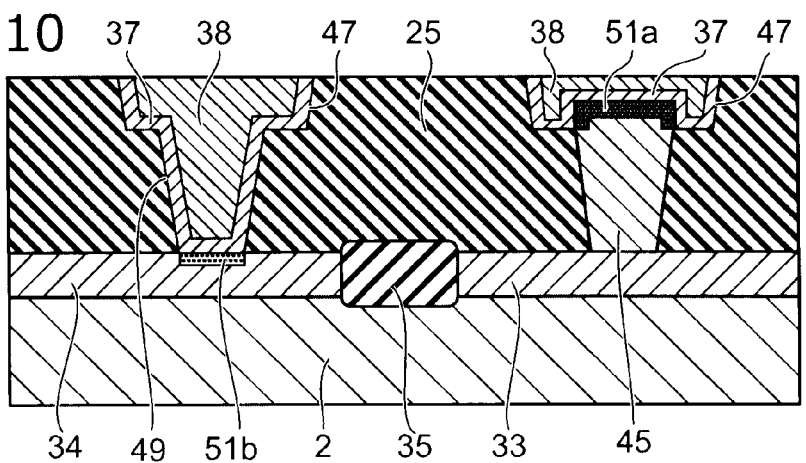

After that, as illustrated in FIG. 10 the metal film deposited on the upper face of the insulating layer 25 is removed by using, for example, the CMP process. Furthermore as above described, an interlayer insulating film is disposed to form a plurality of interconnection layers; and the memory array 3 is formed to complete the semiconductor device 100.

In this manner, according to the embodiment, on the n-type semiconductor region 34 side is provided a dual damascene structure on which the contact plug and interconnection are simultaneously formed, and on the p-type semiconductor region 33 side is provided a single damascene structure on which the contact plug 45 and the interconnection are individually formed.

Further, the contact plug 45 in contact with the p-type semiconductor region 33 includes a high concentration of p-type impurities. In the contact plug 45, diffusion of p-type impurities occurs immediately via crystal boundaries. Hence, when high temperature annealing is performed during the process of manufacturing memory array 3, even if p-type impurities diffuse from the contact plug 45 to the metal interconnection (Ti/TiN film 37) side, p-type impurities are supplied to the interface from the inner part of the contact plug 45, suppressing the reduction of the impurity concentration. Thereby, an ohmic contact with low resistance may be maintained between the metal interconnection and the contact plug 45.

Consequently, p-type impurities are supplied from contact plug 45 side to p-type semiconductor region 33 at the interface between the p-type semiconductor region 33 and the contact plug 45. This compensates for the reduction of the p-type impurities concentration generated on p-type semiconductor region 33 side, and it is possible to maintain a low resistance ohmic contact.

Furthermore, while depositing the polysilicon layer 45a illustrated in FIG. 8A, doping gases such as $C_2H_6$, and so forth may be added. Thereby, in addition to p-type impurities, a polysilicon layer 45a may be formed containing carbon, and the contact plug 45 may include both p-type impurities and carbon. Therefore, it is possible to control the excessive diffusion of p-type impurities from the contact plug 45 to the metal interconnection, and to the p-type semiconductor region. And the heat resistance can be improved between the contact plug 45 and the metal interconnection, and between the contact plug 45 and the p-type semiconductor region.

In this manner, in the embodiment, a metal interconnection with high heat resistance may be formed interposing a polysilicon contact plug only in the contact hole communicating with the p-type semiconductor region 33. Thus, a control circuit can be provided below the memory array 3, and an electrical connection can be provided therebetween with a metal interconnection. Thereby, a reduction in the chip size and an increase in the operation speed of the semiconductor device 100 can be realized at low cost.

FIGS. 11A, 11B, 12A and 12B are cross-sectional views schematically illustrating the manufacturing process of a semiconductor device according to a first variation of the second embodiment.

Figure 11A:
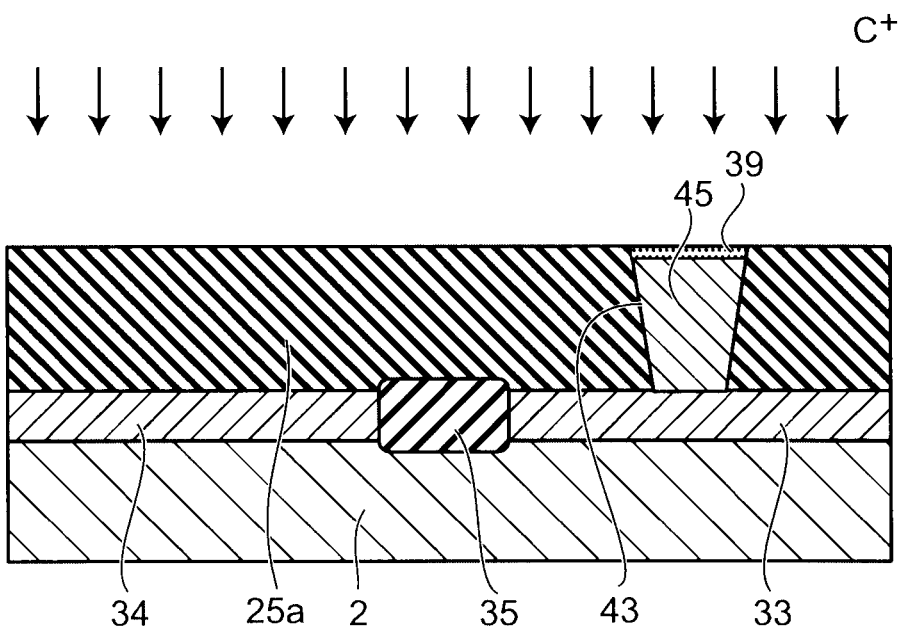
FIGS. 11A to 12B are cross-sectional views schematically illustrating a manufacturing process of a semiconductor device according to a first variation of the second embodiment.

In this variation as illustrated in FIG. 11A, the contact plug 45 is formed in the inner part of the contact hole 43 which communicates with the p-type semiconductor region 33, and carbon is subsequently ion implanted thereon. Thereby, an implantation layer 39 is formed on the top part of the contact plug 45. In this case, the contact hole that communicates with the n-type semiconductor region 34 is not formed, thus the process of forming a resist film 36 in the contact hole can be omitted. Namely, after removing the interconnection deposited on the upper face of the insulating layer 25a, carbon may be ion implanted on the whole surface of the substrate 2.

Figure 11B:
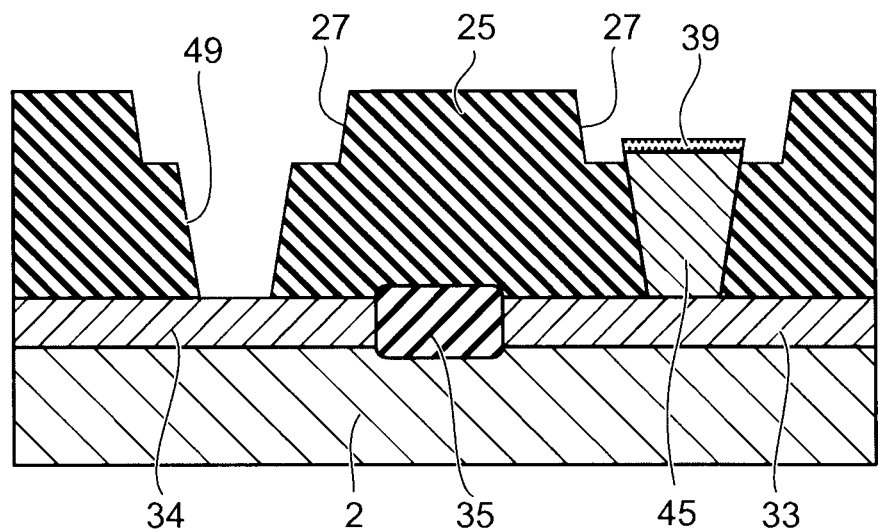

Subsequently, the insulating layer 25b is formed on top of the insulating layer 25a (refer to FIG. 8B), and as illustrated in FIG. 11B, forming the contact hole 49 that communicates with the n-type semiconductor region 34 and the interconnection groove 27.

Figure 12A:
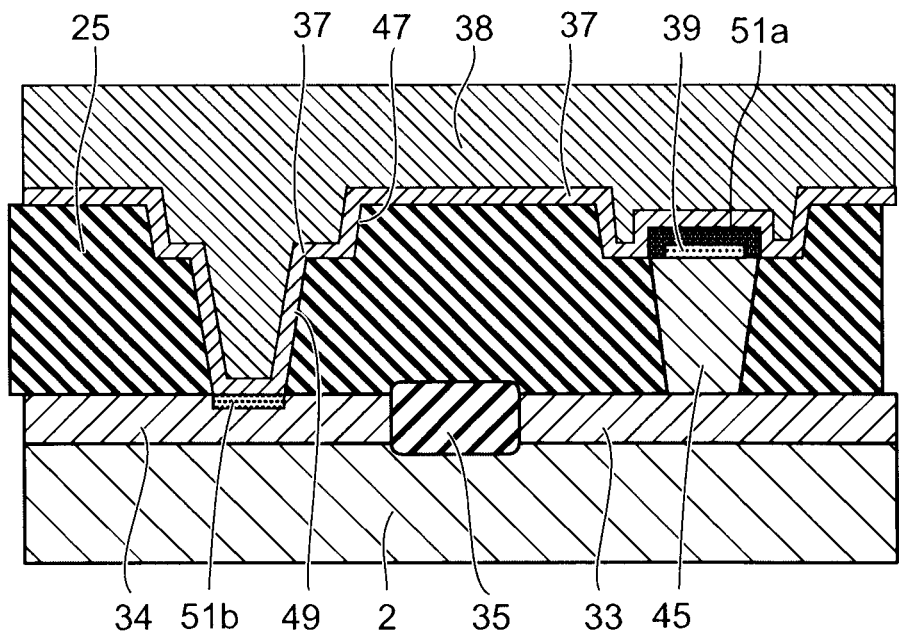

Moreover, as illustrated in FIG. 12A, Ti/TiN film 37 and W film 38 are deposited on the inner part of the contact hole 49, and the inner part of the interconnection groove 47. Then, an implantation layer 39, and a silicide layer 51a superimposed thereon are formed at the top part of the contact plug 45.

Figure 12B:
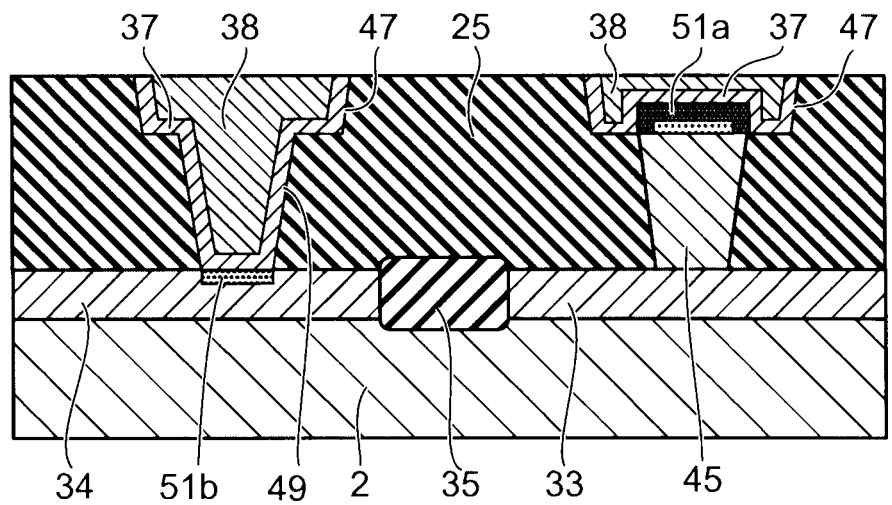

Subsequently, as illustrated in FIG. 12B, the metal interconnection (Ti/TiN film 37 and W film 38) deposited on the upper face of the insulating layer 25 is removed, completing a first layer of metal interconnection.

In this manner, in this variation, with no addition of a photolithography process, an implantation layer of carbon 39 is formed on the top part of the contact plug 45, and the heat resistance can be improved between the metal interconnection and the contact plug 45. Thereby, the impact of annealing during the process of manufacturing memory array 3 can be effectively suppressed at a lower cost.

FIGS. 13A, 13B, 14A and 14B are cross-sectional views schematically illustrating the manufacturing process for a semiconductor device according to a second variation of the second embodiment.

Figure 13A:
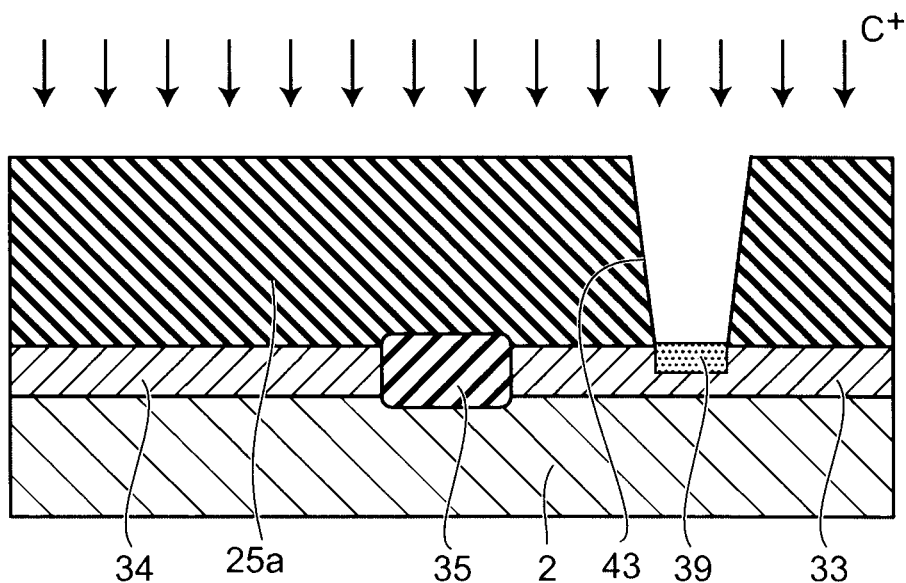
FIGS. 13A to 14B are cross-sectional views schematically illustrating a manufacturing process for a semiconductor device according to a second variation of the second embodiment.

In this variation, as illustrated in FIG. 13A, a contact hole 43 is formed in an insulating layer 25a that covers a p-type semiconductor region 33 and a n-type semiconductor region 34, and the contact hole is in communication with the p-type semiconductor region 33. Thereafter, carbon is ion-implanted in the contact hole. Also in this case, a contact hole communicating with the n-type semiconductor region 34 is not formed, thus ions may be implanted over the whole surface of the substrate 2. Namely, the carbon implanted layer 39 may be selectively formed on the surface of the p-type semiconductor region 33 by a low cost process which reduces the photolithography step.

Figure 13B:
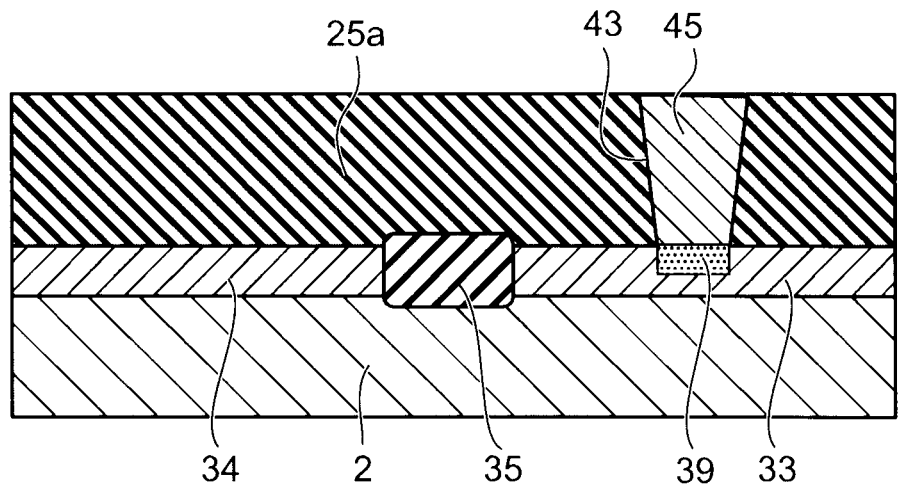

Subsequently, as illustrated in FIG. 13B, a contact plug 45 composed of p-type polysilicon is formed on the inner part of the contact hole 43.

Figure 14A:
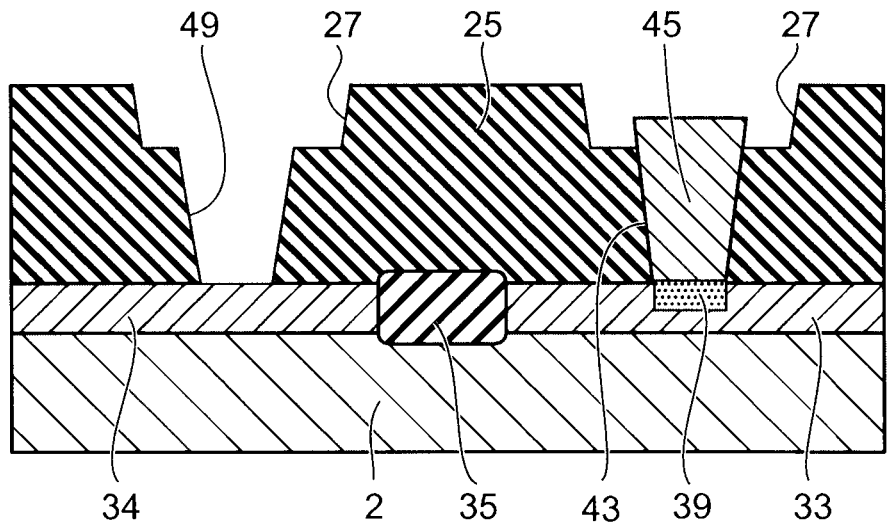
Figure 14B:
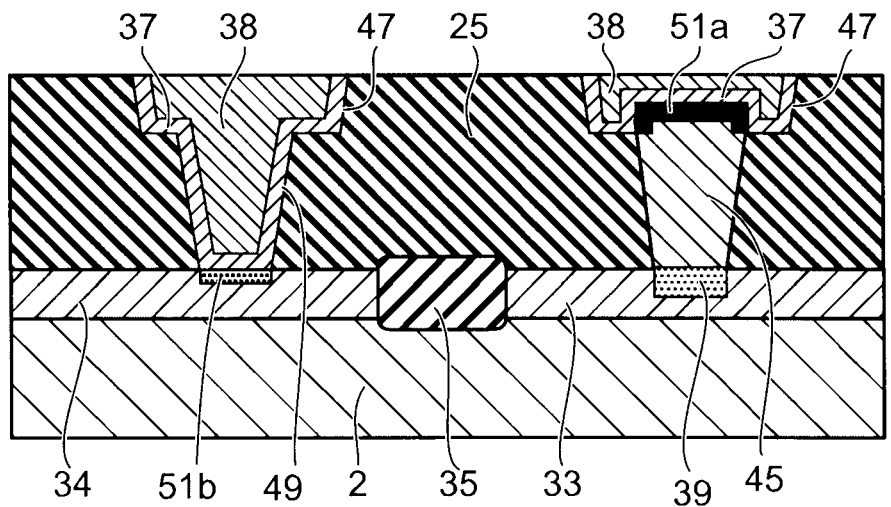

Next, the insulating layer 25b is formed on top of the insulating layer 25a (refer to FIG. 8B), forming, as illustrated in FIG. 14A, the contact hole 49 which communicates with the n-type semiconductor region 34 and the interconnection groove 27. Subsequently, Ti/TiN film 37 and W film 38 are deposited on the inner part of the contact hole 49, and on the inner part of the interconnection groove 47. And as illustrated in FIG. 14B, the metal interconnection deposited on the upper face of the insulating layer 25 is removed, completing a first layer of metal interconnection.

According to this variation, on the bottom of the contact hole 43, the diffusion of p-type impurities can be suppressed and the heat resistance at the interface between the contact plug 45 and the p-type semiconductor region 33 can be improved by forming an implantation layer of carbon 39 on the surface of the p-type semiconductor region 33.

FIGS. 15A, 15B, 16A and 16B are cross-sectional views schematically illustrating the manufacturing process of a semiconductor device according to a third variation of the second embodiment.

Figure 15A:
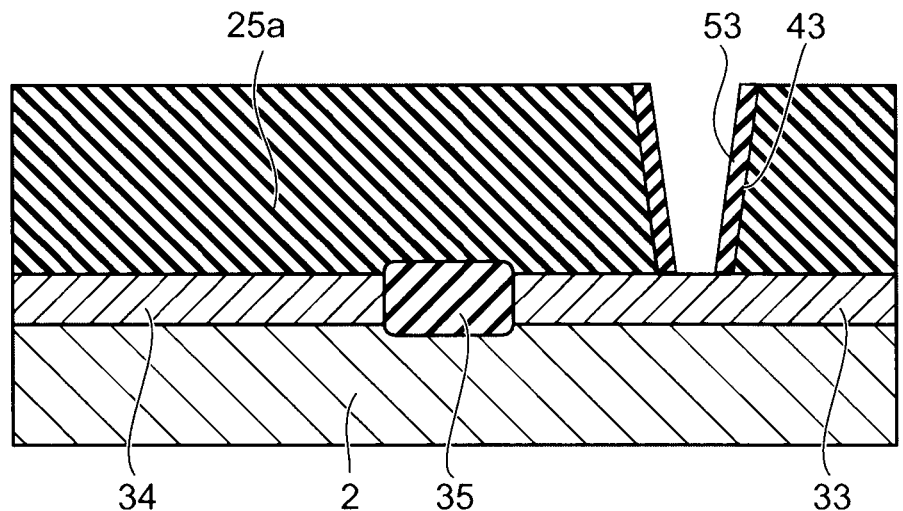
FIGS. 15A to 16B are cross-sectional views schematically illustrating a manufacturing process of a semiconductor device according to a third variation of the second embodiment.

In this variation, as illustrated in FIG. 15A, a contact hole 43 is formed in an insulating layer 25a that covers a p-type semiconductor region 33 and a n-type semiconductor region 34, and the contact hole 43 is in communication with the p-type semiconductor region 33. Furthermore, a silicon nitride film 53 is formed on the surface of insulating layer 25a, which is the side surface of the contact hole 43. The silicon nitride film 53 is formed on the top surface of the insulating layer 25a and the inner surface of the contact hole 43 through the CVD process. The silicon nitride film formed on the upper face of insulating layer 25a and on the bottom surface of the contact hole 43 is removed using anisotropic dry-etching, and thereby the silicon nitride film 53 can be left behind only on the side surfaces of the contact hole 43.

Figure 15B:
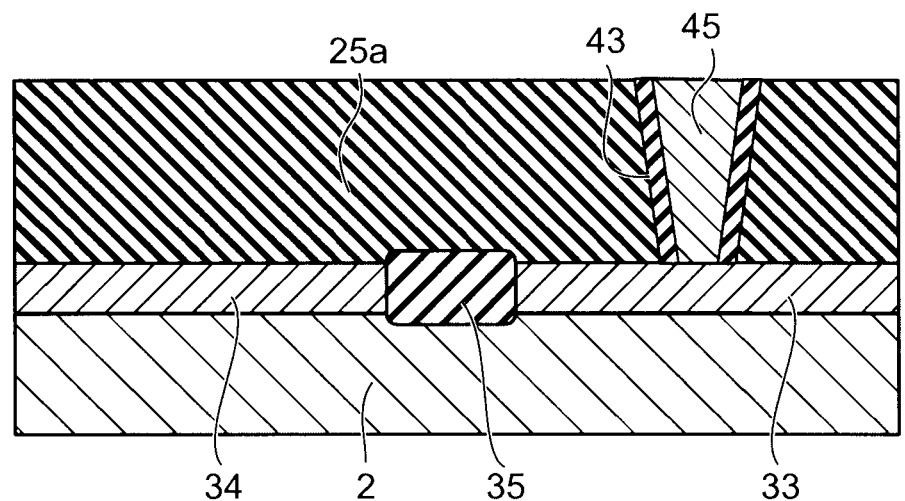

Subsequently, as illustrated in FIG. 15B, a contact plug 45 composed of a p-type polysilicon is formed on the inner part of the contact hole 43.

Figure 16A:
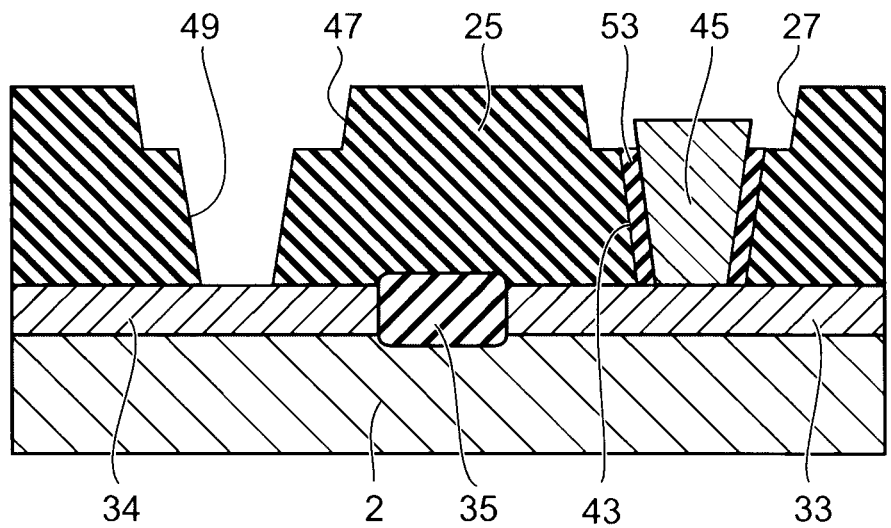
Figure 16B:
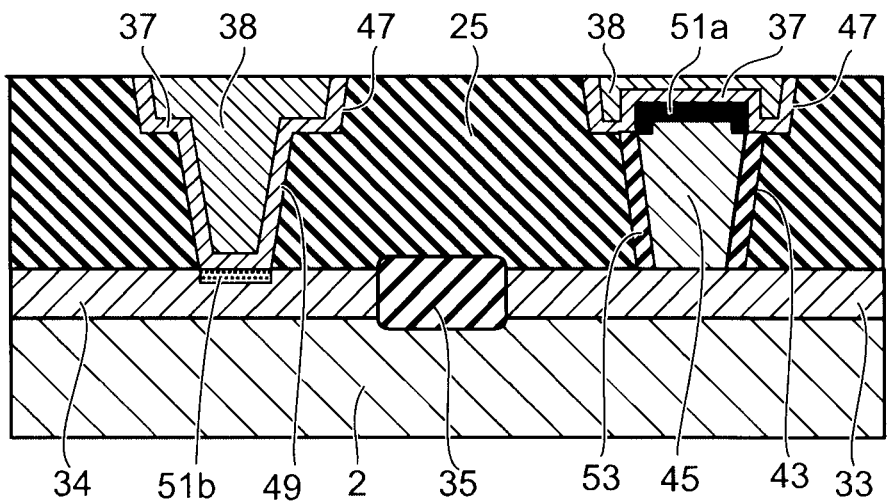

Next, an insulating layer 25b is formed on top of the insulating layer 25a, and as illustrated in FIG. 16A, forming the contact hole 49 that is in communication with the n-type semiconductor region 34, and the interconnection groove 27. Thereafter, Ti/TiN film 37 and W film 38 are deposited on the inner part of the contact hole 49, and on the inner part of the interconnection groove 47. Then as illustrated in FIG. 14B the metal interconnection deposited on the upper face of insulating layer 25 is removed, completing the first layer of metal interconnection.

According to this variation, the silicon nitride film 53 provided on the side surfaces of the contact hole 43 suppresses the diffusion of p-type impurities from the contact plug 45 towards the insulating layer 25. Thereby, the reduction of the concentration of the p-type impurities within the contact plug 45 is suppressed, and the heat resistance of the contact plug 45 can be improved.

FIGS. 17A, 17B, 18A and 18B are cross-sectional views schematically illustrating the manufacturing process for a semiconductor device according to a fourth variation of the second embodiment.

Figure 17A:
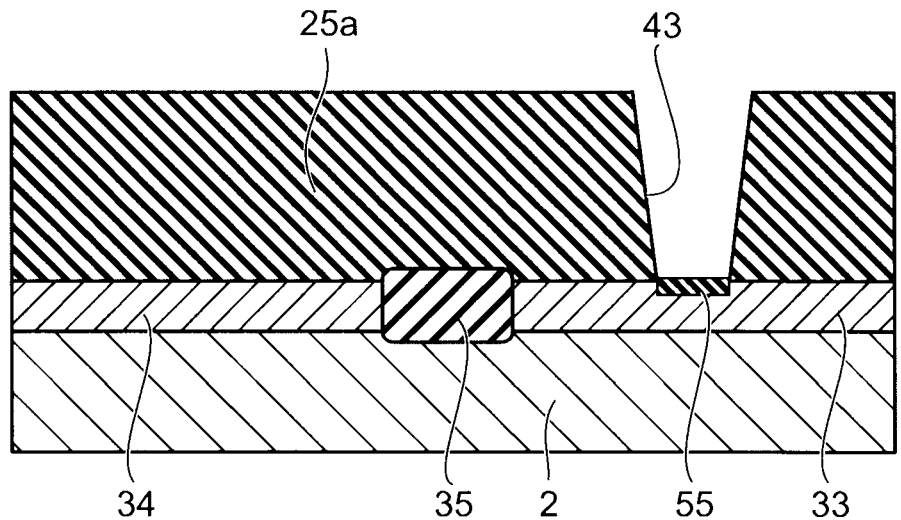
FIGS. 17A to 18B are cross-sectional views schematically illustrating a manufacturing process for a semiconductor device according to a fourth variation of the second embodiment.

In this variation, as illustrated in FIG. 17A, a contact hole 43 that communicates with a p-type semiconductor region 33 is formed in an insulating layer 25a that covers the p-type semiconductor region 33 and an n-type semiconductor region 34. After removing the natural oxidation film on the surface of the p-type semiconductor region 33, for example, the contact hole 43 is exposed to a high temperature atmosphere containing ammonia ($NH_3$) before a polysilicon layer 45a (refer to FIG. 8A) is deposited on the inner part thereof. Thus, a thin silicon nitride film 55 can be formed on the surface of the p-type semiconductor region 33 exposed at the bottom of the contact hole 43.

Figure 17B:
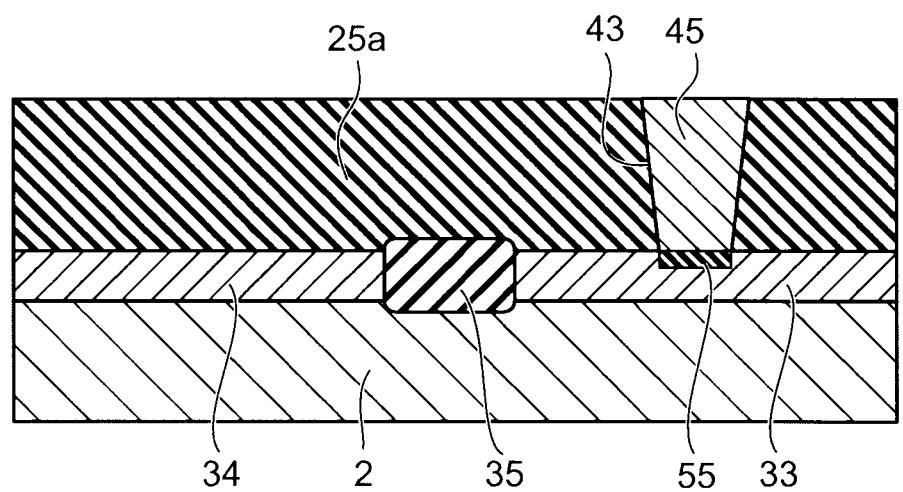

Thereafter, as illustrated in FIG. 17B, a contact plug 45 composed of p-type polysilicon can be formed on the inner part of the contact hole 43.

Figure 18A:
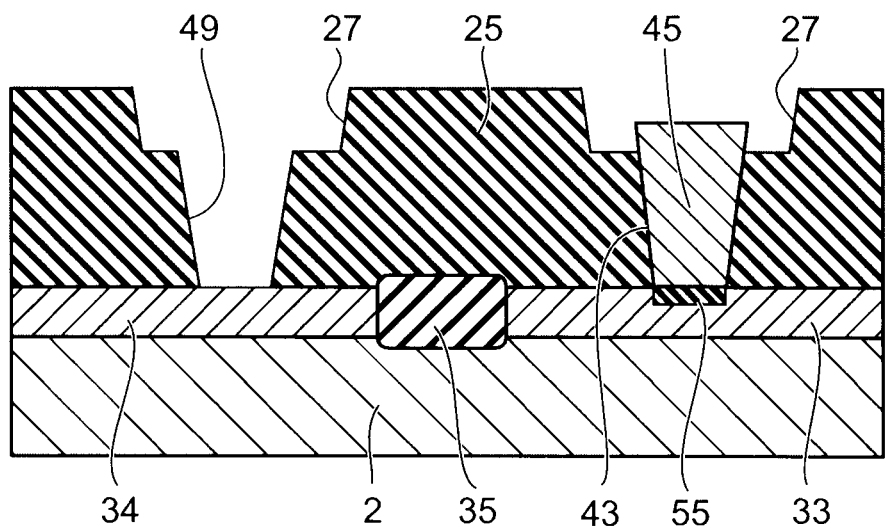
Figure 18B:
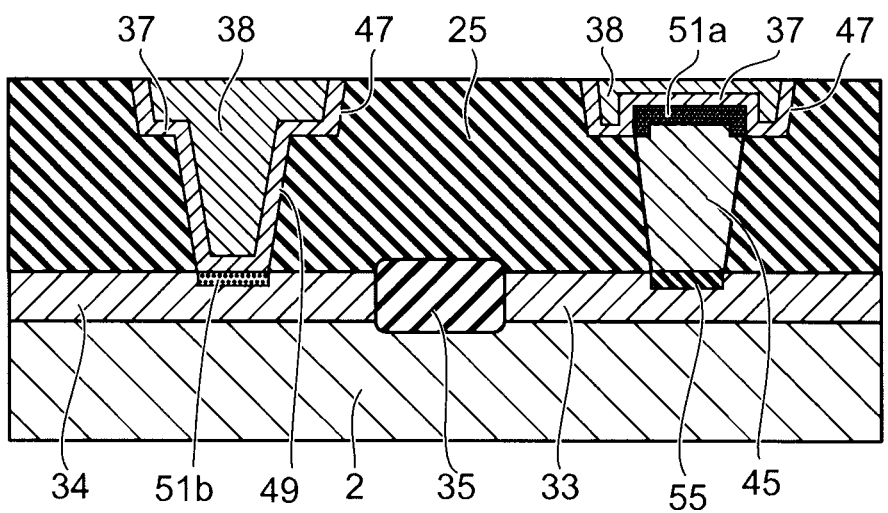

Next, an insulating layer 25b is formed on the insulating layer 25a, forming as illustrated in FIG. 18A, a contact hole 49 which communicates with the n-type semiconductor region 34, and interconnection groove 27. Ti/TiN film 37 and W film 38 are deposited on the inner part of the contact hole 49, and on the inner part of interconnection groove 47. Then as illustrated in FIG. 18B, the metal interconnection deposited on the upper face of the insulating layer 25 is removed, completing the first layer of metal interconnection.

According to this variation, the silicon nitride film 55 provided on the bottom of the contact hole 43, suppresses the diffusion of p-type impurities from the contact plug 45 towards the p-type semiconductor region 33. This suppresses the reduction of the concentration of the p-type impurities within the contact plug 45, thereby the heat resistance of the contact plug 45 can be improved.

The thickness of the silicon nitride film 55 is, for example, not greater than 1 nm. Thereby, the diffusion of p-type impurities can be suppressed without greatly affecting the electrical resistance between the p-type semiconductor region 33 and the contact plug 45.

It is possible for the manufacturing process according to the above mentioned second embodiment, and the processes according to the first through fourth variations to be executed in combinations thereof, and thereby the heat resistance between the contact plug 45 and the p-type semiconductor region 33, and the metal interconnection can be further improved.

Additionally, each element provided in each of the above described specific examples, may be combined as far as possible, and insofar as those combinations include the characteristics of this invention, are within the scope of this invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of manufacturing a semiconductor device comprising a memory array provided on a substrate, and a control circuit provided on a surface of the substrate between the substrate and the memory array, the method comprising:
    forming, in an insulating layer covering a p-type semiconductor region and an n-type semiconductor region of the control circuit, a first contact hole communicating with the p-type semiconductor region;
    forming a contact plug, in contact with the p-type semiconductor region, within the first contact hole;
    forming, in the insulating layer, a second contact hole communicating with the n-type semiconductor region; and
    forming an interconnection contacting the contact plug and the n-type semiconductor region exposed within the second contact hole.

2. The method according to claim 1, further comprising:
    forming an interconnection groove in the insulating layer, wherein a top face of the contact plug is exposed and the second contact hole is provided in a bottom face of the interconnection groove.

3. The method according to claim 2, wherein the interconnection groove is formed so that a portion of the contact plug protrudes from the bottom face thereof.

4. The method according to claim 2, wherein the interconnection is formed within the interconnection groove.

5. The method according to claim 1, wherein the contact plug is made of polycrystalline silicon and contains a higher concentration of p-type impurities than the p-type semiconductor region.

6. The method according to claim 1 wherein a silicide layer is formed between a top face of the contact plug and the interconnection, and between the n-type semiconductor region and the interconnection.

7. The method according to claim 1, further comprising:
    ion-implanting carbon into a top face of the contact plug.

8. The method according to claim 7, wherein the implantation layer of carbon and a silicide layer are formed on a top face of the contact plug.

9. The method according to claim 1, further comprising:
    ion-implanting carbon into a bottom of the first contact hole.

10. The method according to claim 1 wherein the contact plug further includes carbon.

11. The method according to claim 1, further comprising: forming a silicon nitride film having a thickness of not greater than 1 nm between the contact plug and the p-type semiconductor region.

12. The method according to claim 1, further comprising: forming a silicon nitride film on a surface of the insulating layer in the first contact hole.

13. The method according to claim 1, wherein the interconnection is a metal interconnection.

14. The method according to claim 1, wherein the interconnection includes a titanium (Ti) film contacting the contact plug and the n-type semiconductor region.

15. The method according to claim 1, wherein the interconnection includes a high melting point metal.

16. A semiconductor device comprising:
    a memory array provided on a substrate;
    a control circuit provided on the substrate between the substrate and the memory array;
    an insulating layer covering a p-type semiconductor region and an n-type semiconductor region of the control circuit;
    a contact plug provided within a first contact hole communicating from a surface of the insulating layer to the p-type semiconductor region, the contact plug being in contact with the p-type semiconductor region; and an interconnection connected to the contact plug and to the n-type semiconductor region exposed within a second contact hole communicating from the surface of the insulating layer to the n-type semiconductor region.

17. The device according to claim 16, wherein a carbon implanted layer and a silicide layer are provided on a top face of the contact plug.

18. The device according to claim 16, wherein a carbon implanted layer is provided on a portion of the p-type semiconductor region in contact with the contact plug.

19. The device according to claim 16, wherein the contact plug faces the insulating layer via a silicon nitride film on the side face of the first contact hole.

20. The device according to claim 16, wherein a silicon nitride film is provided on a portion of the p-type semiconductor region in contact with the contact plug.

* * * * *